US006438149B1

(12) United States Patent
Tayebati et al.

(10) Patent No.: US 6,438,149 B1
(45) Date of Patent: *Aug. 20, 2002

(54) MICROELECTROMECHANICALLY TUNABLE, CONFOCAL, VERTICAL CAVITY SURFACE EMITTING LASER AND FABRY-PEROT FILTER

(75) Inventors: Parviz Tayebati, Watertown, MA (US); Masud Azimi, Nashua, NH (US); Peidong Wang, Woburn; Daryoosh Vakhshoori, Cambridge, both of MA (US)

(73) Assignee: CoreTek, Inc., Wilmington, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/105,399

(22) Filed: Jun. 26, 1998

(51) Int. Cl.[7] ................................................. H01S 5/00

(52) U.S. Cl. .......................................... 372/45; 372/20

(58) Field of Search ..................................... 372/45, 20

(56) References Cited

U.S. PATENT DOCUMENTS

| | | | |
|---|---|---|---|
| 4,825,262 A | 4/1989 | Mallinson | 356/352 |
| 4,859,060 A | 8/1989 | Katagiri et al. | 356/352 |
| 5,022,745 A | 6/1991 | Zayhowski et al. | 350/608 |

(List continued on next page.)

FOREIGN PATENT DOCUMENTS

WO    WO9814807    4/1998    ........... G02B/6/293

OTHER PUBLICATIONS

Larson, M. C., et al., "Continuously tunable micromachined vertical cavity surface emitting laser with 18 nm wavelength range", Electronics Letters, vol. 32, No. 4, 330–332, Feb. 15, 1996.

Wu, M. S. et al., "Tunable micromachined vertical–cavity surface emitting laser", Electronics Letters, vol. 31, No. 19, pp. 1671–1672, Sep. 14, 1995.

Larson, M. C. et al., "Broadly–tunable resonant–cavity light emission", Applied Physics Letters, vol. 67, No. 5, 590–592, Jul. 31, 1995.

(List continued on next page.)

Primary Examiner—James W. Davie
Assistant Examiner—Gioacchino Inzirillo
(74) Attorney, Agent, or Firm—Pandiscio & Pandiscio, P.C.

(57) ABSTRACT

A method is provided for fabricating microelectromechanically tunable vertical-cavity surface-emitting lasers and microelectromechanically tunable Fabry-Perot filters with precise lateral and vertical dimensional control. Strained reflective dielectric film(s) are applied to a multiple quantum well structure to electronically band-gap-engineer the quantum wells. Appropriate strain in the reflective dielectric film layers is also used to create appropriate curvature in one of the reflective dielectric film stacks so as to form a confocal cavity between a planar reflective dielectric film layer and the curved reflective dielectric film layer in the vertical cavity surface emitting laser or filter. Laser and filter structures are also provided which include a suspended membrane structure made of a dielectric/metal membrane or metal film that supports a cavity-tuning reflective dielectric film stack while being anchored at the perimeter by metal support post(s). Precise air-cavity length and lateral dimensions are achieved by micro-die-casting using a micromachined sacrificial polyimide or aluminum disk. Further, tuning is achieved by translational movement of the cavity-tuning reflective dielectric film stack in a controlled electrostatic field.

15 Claims, 10 Drawing Sheets

U.S. PATENT DOCUMENTS

| | | | |
|---|---|---|---|
| 5,142,414 A | 8/1992 | Koehler | 359/578 |
| 5,291,502 A * | 3/1994 | Pezeshki | 372/20 |
| 5,331,658 A | 7/1994 | Shieh et al. | 372/50 |
| 5,339,326 A | 8/1994 | Tsujimura et al. | 372/49 |
| 5,491,710 A | 2/1996 | Lo | 372/45 |
| 5,561,523 A | 10/1996 | Blomberg et al. | 356/352 |
| 5,561,680 A | 10/1996 | Haberern et al. | 372/46 |
| 5,629,951 A | 5/1997 | Chang-Hasnain et al. | 372/20 |
| 5,646,729 A | 7/1997 | Koskinen et al. | 356/352 |
| 5,739,945 A | 4/1998 | Tayebati | 359/291 |
| 5,771,253 A | 6/1998 | Chang-Hasnain et al. | 372/20 |
| 5,818,862 A | 10/1998 | Salet | 372/46 |
| 5,825,796 A | 10/1998 | Jewell et al. | 372/45 |
| 5,879,961 A | 3/1999 | Scott | 438/32 |

OTHER PUBLICATIONS

Tran, A. T .T .T. et al., "Surface Micromachined Fabry–Perot Tunable Filter", IEEE Photonics Technology Letters, vol. 8, No. 3, 393–395, Mar. 1996.

Larson, M. C. et al. "Vertical Coupled–Cavity Microinterferomter on GaAs With Deformable–Membrane Top Mirror", IEEE Photonics Technology Letters, vol. 7, No. 4, 382–384, Apr. 1995.

* cited by examiner

MICROELECTROMECHANICALLY TUNABLE, CONFOCAL, VERTICAL CAVITY SURFACE EMITTING LASER AND FABRY-PEROT FILTER

REFERENCE TO PENDING PRIOR PROVISIONAL PATENT APPLICATION

This patent application claims benefit of pending prior U.S. Provisional Patent Application Ser. No. 60/068,931 filed Dec. 12, 1997 for MICROELECTROMECHANICALLY TUNABLE CONFOCAL VERTICAL CAVITY SURFACE EMITTING LASER VCSEL AND FABRY PEROT FILTER.

FIELD OF THE INVENTION

The present invention relates to semiconductor optoelectronic devices in general and, more particularly, to wavelength tunable surface emitting semiconductor lasers and filters.

BACKGROUND OF THE INVENTION

Tunable vertical cavity surface emitting lasers (VCSEL's) and filters have recently generated considerable interest in the art. This is because these devices show great promise not only for increasing bandwidth during wavelength division multiplexing (WDM) in fiber-optic communications, but also for use in switches, routers, highly compact spectroscopic interferometers, optical trans-receivers and numerous other applications.

More particularly, VCSEL's are extremely attractive for integrated optoelectronic circuits. For one thing, they operate at a single longitudinal mode with a circular aperture, thereby providing efficient coupling to fibers. In addition, they are compact, and can be monolithically fabricated in large, dense arrays on a wafer-scale.

As a fixed wavelength light source, VCSEL's have demonstrated limited application and functionality.

Some past effort has been directed towards achieving wavelength tuning in VCSEL's by introducing refractive index changes with (1) temperature (see, for example, Berger, P. R., Dutta, N. K., Choquette, K. D., Hasnain, G., and Chand, N., "Monolithically Peltier-cooled vertical-cavity surface-emitting lasers", Applied Physics Letters, Vol. 59, No. 1, pp. 117–119, 1991; and Chang-Hasnain, C. J., Harbison, J. P., Zah, C. E., Florez, L. T., and Andreadakis, N. C., "Continuous wavelength tuning of two-electrode vertical cavity surface emitting lasers", Electron. Lett., Vol. 27, No. 11, pp. 1002–1003, 1991); or (2) carrier injection (see, for example, Gmachi, C., Kock, A., Rosenberger, M., Gornik, E., Micovic, M., and Walker, J. F., "Frequency tuning of a double-heterojunction AlGaAs/GaAs-vertical-cavity surface-emitting laser by a serial integrated in-cavity modulator diode", Applied Physics Letters, Vol. 62, No. 3, pp. 219–221, 1993).

Both of these techniques provide a tuning range of roughly 10 nm; however, this is still considerably short of the several tens of nanometer tuning range which is necessary for bandwidth-hungry WDM and dense WDM applications.

In contrast, variation of the length of a Fabry-Perot cavity has been shown to be a viable technique for accomplishing wavelength tuning in VCSEL's without affecting the laser gain medium. This can be achieved in surface emitting devices by the provision of a top mirror that can be translated relative to the bottom mirror by the application of an electrostatic field. This technique has been implemented in tunable Fabry-Perot devices such as (1) filters (see, for example, Larson, M. C., Pezeshki, B., and Harris, J. S., "Vertical coupled-cavity microinterferometer on GaAs with deformable-membrane top mirror", IEEE Photonics Technology Letters, Vol. 7, pp. 382–384, 1995; and Tran, A. T. T. T., Lo, Y. H., Zhu, Z. H., Haronian, D., and Mozdy, E., "Surface Micromachined Fabry-Perot Tunable Filter", IEEE Photonics Technology Letters, Vol. 8, No. 3, pp. 393–395, 1996); (2) light emitting diodes (see, for example, Larson, M. C., and Harris, J. S., "Broadly-tunable resonant-cavity light emission", Applied Physics Letters, Vol. 67, No. 5, pp. 590–592, 1995); and (3) VCSEL's (see, for example, Wu, M. S., Vail, E. E., Li, G. S., Yuen, W., and Chang-Hasnain, C. J., "Tunable micromachined vertical-cavity surface emitting laser", Electronic Letters, Vol. 31, No. 4, pp. 1671–1672, 1995; and Larson, M. C., Massengale, A. R., and Harris, J. S., "Continuously tunable micromachined vertical-cavity surface emitting laser with 18 nm wavelength range", Electronic Letters, Vol. 32, No. 19, pp. 330–332, 1996).

In devices of this sort, the amount of deflection of the top mirror depends on a number of parameters, e.g., the length, width, thickness and Young's modulus of the mirror-supporting arm. Although the aforementioned width, thickness and Young's modulus of the mirror-supporting arm are generally fairly precisely controllable, the current fabrication techniques used in such devices generally provide very limited control over the exact length of the supporting arms. This results in significant performance variations from device-to-device and batch-to-batch.

The present invention provides the precise dimensional control necessary for realizing reproducible, tunable Fabry-Perot devices that are necessary for producing commercially usable tunable filters and VCSEL's.

Some Aspects Of The Present Invention

This patent application claims benefit of pending prior U.S. Provisional Patent Application Ser. No. 60/068,931 filed Dec. 12, 1997 for MICROELECTROMECHANICALLY TUNABLE CONFOCAL VERTICAL CAVITY SURFACE EMITTING LASER VCSEL AND FABRY PEROT FILTER, which document is hereby incorporated herein by reference.

The present invention comprises a novel, microelectromechanically (MEM) tunable, confocal filter.

The present invention also comprises a novel, MEM tunable, confocal vertical cavity surface emitting laser (VCSEL).

The laser preferably utilizes post-growth control of strain in the quantum wells.

In addition, the present invention also comprises a novel technique for VCSEL/filter fabrication which provides the precise dimensional control necessary for mass producing reliable devices having predictable performance characteristics.

More particularly, the present invention provides a new technique for introducing appropriate strain into a thin, lattice-matched layer of laser active medium, i.e., in the quantum wells, after crystal growth has been effected. This is achieved by depositing distributed Bragg reflectors (DBR's) on the laser active medium, wherein the distributed Bragg reflectors comprise carefully engineered, strained, dielectric multi-layer films. By carefully modifying the strain in the deposited DBR films, the strain and the gain properties of the quantum well regions can be optimized. In VCSEL's, when quantum wells are under compressive strain, the differential gain of the laser increases, and threshold current density decreases, thereby dramatically improving the performance of the VCSEL's. Tensile strain, on the other hand, has adverse effects on the lasing properties of VCSEL's. Dielectric multi-layer combinations, such as silicon (Si) and aluminum-oxide ($Al_2O_3$), or Si and silicon-dioxide ($SiO_2$), or Si and magnesium-oxide (MgO), or $TiO_2$ and $SiO_2$, can be deposited by means of ion-beam assisted electron-beam evaporation or ion-beam assisted ion-beam sputtering, with a controlled strain in the deposited films. By carefully controlling the ion-beam voltage and current, dielectric films with either tensile or compressive strain can be deposited, with the magnitude of the strain ranging from a few Kilo Pascal (KPa) to a few Giga Pascal (Gpa). These multi-layer dielectric films provide a multi-purpose function, i.e., they induce strain in the quantum wells, they provide optical feedback to the gain medium, and they efficiently remove heat from the active region, all of which are important aspects of creating commercially useful VCSEL's, especially in the wavelength range of between about 1300 nm and about 1500 nm.

The present invention also includes another innovation for producing, via micromachining, a confocal cavity VCSEL that comprises a tunable cavity formed between a set of planar DBR's and a set of curved DBR's. Curvature in the DBR's is achieved by the judicious introduction of an appropriate magnitude of strain in the deposited layers. By the creation of a confocal microcavity, the spatial mode and divergence of the laser mode can be controlled precisely so as to (a) produce single spatial modes by optically restricting the lasing domain in the gain region, and (b) manipulate the divergence angle of the VCSEL so as to optimize the coupling of generated light into a single mode fiber.

The fabrication techniques of the present invention provide extremely precise control of the physical dimensions of both the top DBR structure and the supporting structure, which is indispensable for achieving highly reproducible performance with inconsequential device-to-device variation.

Another aspect of the present invention is a confocal microelectromechanical tunable Fabry-Perot structure. When the gain region is left out of the foregoing confocal VCSEL structure, only the optical cavity remains, and the device acts as a confocal Fabry-Perot filter. The confocal nature of the short cavity (e.g., 0.2–10 micron) device allows efficient coupling of light (i) from an input single mode fiber to the device, and (ii) back out to a single mode output fiber.

Confocal tunable filter and VCSEL devices are depicted in FIGS. 1 and 2, respectively. These devices operate at a single longitudinal mode over the entire bandwidth (e.g., 30–120 nm) of the gain medium, in the case of a VCSEL; and over a 100 nm tuning range, in the case of a filter.

As depicted in FIG. 1, the tunable Fabry-Perot filter device comprises (i) a distributed Bragg reflector (DBR) with a curvature R, formed by high index contrast multi-layers atop a thin membrane (or tethers) of silicon nitride ($Si_3N_4$) or a thin metal film such as titanium-tungsten (TiW), wherein the membrane is supported at its perimeter by thicker metal posts, (ii) an air cavity formed by selective removal of a sacrificial layer, and (iii) a bottom set of dielectric DBR's deposited in the substrate facing the top DBR.

In the case of a VCSEL, a gain medium, consisting of multiple quantum wells, is inserted in the air cavity as shown in FIG. 2. These VCSEL's can be photo-pumped, or intra-cavity electrical interconnections can be made for current injection.

Of course, it is also to be appreciated that the tunable filter, and/or the tunable VCSEL, can be formed with a top distributed Bragg reflector having a planar configuration, without departing from the scope of the present invention.

The following is a list of some technological breakthroughs resulting from the present invention.

Strain-Optimized Fixed-Wavelength VCSEL's

Since, in a VCSEL, the resonant optical mode interacts with an extremely small volume of gain medium, it is imperative that the gain medium provide maximum differential gain, while the DBR's provide maximum feedback and the least thermal resistance possible.

Although using compressively strained multiple quantum wells can provide the maximum possible gain, there is a limitation on the maximum number of strained quantum wells that can be grown without generating crystalline defects.

A solution to this problem is to grow strain-compensated multiple quantum wells. In practice, however, this is difficult and costly. Although GaAs/GaAlAs-based VCSEL's show maturity, the presently preferred material system for long wavelength (e.g., 1300 nm and 1500 nm) lasers is InP/InGaAsP-based, and much improvement upon this material system remains to be made.

Since the maximum index contrast between InP and InGaAsP is only about 0.2, a large number of quarter-wave stacks are required in order to provide sufficient feedback. This, however, causes significant resistive losses in the device, and an unacceptable degree of thermal bottleneck. In addition, the low index-contrast also results in relatively narrow bandwidth mirrors, thereby placing a severe constraint on the accuracy of the mirror thickness.

The present device may consist of an InGaAsP/InGaAs multiple quantum well (MQW), with a dielectric DBR on top and a dielectric DBR between the MQW and the substrate. See, for example, FIG. 5, which illustrates a fixed wavelength VCSEL. If desired, the fixed wavelength VCSEL may have a curved top distributed Braff reflector. Both DBR's are deposited by vacuum deposition techniques.

As summarized below, the present invention provides a solution to all of the foregoing problems, simultaneously, with implications of significant cost reduction and high manufacturing yield.

1. Deposited DBR's can externally alter the strain in the quantum well regions of the MQW, thereby modifying the gain coefficient, threshold current and slope-efficiency. By controlling the strain of the deposited DBR, the strain in the quantum wells, and therefore the lasing properties of the VCSEL, can be optimized. Post crystal-growth modification of strain in the quantum wells relieves the constraint of devising expensive and difficult strain-compensation techniques employed in epitaxial crystal growth (MBE or MOCVD).

2. In epitaxially grown monolithic VCSEL's, thickness variations across the wafer cause lasing wavelength variations, resulting in poor yield. Since the index contrast between Si and $Al_2O_3$ is relatively high (i.e., about 2.8), with only four pairs of DBR's, over 99.9% reflectivity can be achieved over a large bandwidth (e.g., 500 nm). As a result, a Fabry-Perot cavity formed by these DBR's creates a high-Q cavity with sufficient feedback. Since the mirrors are broad band, the stopgap of the mirror can easily straddle over 100 nm of the gain spectrum. Any thickness variations in the active layer, and/or in the cladding thickness over the wafer, can be compensated for by depositing phase-compensating layers of dielectric films before depositing the final DBR mirror. This allows harvesting most of the wafer for the desired wavelength of emission. The high reflectivity of the DBR mirrors also helps to lower threshold conditions.

3. Dielectric mirrors formed by materials such as Si and $Al_2O_3$ or MgO have a very high thermal conductivity, thereby providing for efficient removal of heat from the active region. In addition, only a few pairs of DBR's are required; hence, the thermal path to the heat sink is shorter in the present invention than in traditional semiconductor DBR's, thereby adding to the efficient heat removal process.

Wavelength Tunable VCSEL's

A schematic diagram of the steps used in fabricating a novel wavelength tunable VCSEL based on the present invention is shown in FIG. 4. The device comprises bottom DBR's consisting of high index-contrast dielectric pairs such as $Si/Al_2O_3$, $Si/SiO_2$, $Si/MgO$, or $TiO_2/SiO_2$, along with selectively-deposited top DBR mirrors, with an air-cavity and an active medium embedded in the Fabry-Perot cavity formed by the two DBR's.

The present invention also accommodates a hybrid mirror system such as bottom epitaxially grown DBR's and top deposited DBR's.

The top DBR resides on a thin, supporting membrane or multiple tether structure made of $Si_3N_4$ or metal (TiW) that is supported at its perimeter by a thicker metal support (see FIGS. 6A–6E). This forms a trampoline type of structure. In the case of a circular membrane structure, radially extending openings in the $Si_3N_4$ or metal film (TiW) are used for selectively removing an underlying sacrificial layer during the top DBR release process, as will be discussed further below.

By applying an appropriate voltage across this membrane and the bottom DBR's, the trampoline structure, along with the top mirror, can be translated toward, and away from, the bottom DBR so as to tune the laser emission. Since the DBR's are broad band, tuning is possible over the entire bandwidth of the laser gain spectrum, which is nominally about 60 nm.

One of the important features of the present invention is that the new fabrication process provides precise control over the lateral dimensions of the trampoline structure and the air-cavity length, both of which are important for the consistent manufacturing of substantially identical devices. This is made possible in the present invention by allowing the sacrificial layer to act as a die in order to define the lateral dimensions of the trampoline structure and the vertical dimension of the air-cavity. As a result, the possible ill effects of uncontrolled dimensions, ensuing during the selective removal of the sacrificial layer, are effectively eliminated.

In addition, the new devices are small and compact (approximately 500 μm×500 μm), thereby allowing arrays thereof to be manufactured and coupled to fibers.

Wavelength Tunable Filter

As shown in FIG. 3, the tunable Fabry-Perot filter is obtained by omitting the quantum well gain material from the above-described VCSEL structure.

High index-contrast DBR stacks provide broad bandwidth (e.g., 500 nm); hence, for a lambda-cavity, the Fabry-Perot resonance can be tuned over the entire bandwidth of the DBR's. Since the reflectivity of the DBR's is high, an extremely narrow (sub-Angstrom) linewidth is attainable.

Tuning speed in these devices is on the order of microseconds, making them one of the fastest tunable filters, with extremely high spectral resolution. These devices are also easily mass-produced using standard semiconductor fabrication techniques, thereby making them affordable for consumer products.

Tunable VCSEL/Filter With Confocal Cavity

The MEM tunable Fabry-Perot filter with confocal cavity is a highly innovative resonator design that comprises an air cavity between a first set of distributed Bragg reflectors (DBR's) that are planar and a second set of DBR's having a finite radius of curvature. These two sets of DBR's form a confocal cavity as shown in FIG. 1.

One innovation of this design is the fact that the curvature of one of the mirrors creates a micro-resonator that can sustain Hermite Gaussian modes. As described below, by introduction of appropriate curvature in the top mirror, coupling of light from a standard single mode fiber into and out of the device can be simplified by avoiding the use of lenses that are otherwise necessary.

It is well known that the Rayleigh range, $z_0$, which defines the distance at which the wave front is most curved, is related to mirror curvature, R, and cavity length, d, by the equation $z_0=[(R-d)/d]^{1/2}$ ("Equation 1"). For instance, a resonator with a cavity length of 1.5 microns, and a radius of curvature of 1.5 millimeter for the curved DBR's, leads to a $z_0$ value of 150 microns, and to a fundamental mode beam waist, $W_0$, of 8.5 microns at a wavelength, λ, of 1.5 microns, according to the relationship $W_0=(Z_0\lambda/\pi)^{1/2}$ ("Equation 2"). Since the value of the mode size at position z is given by the equation $W(z)=W_0[1+(z/z_0)^2]^{1/2}$ ("Equation 3"), and since $z_0$ is approximately a hundred times larger than the cavity length, the mode size remains virtually the same over the length of the cavity. Consequently, light from a 9-micron-core, single-mode fiber on the input side can excite this fundamental mode, and the transmitted single mode beam can be efficiently coupled to a single-mode fiber. As such, by curving the mirror, the mode spot size can be adjusted to match that of a single mode fiber without requiring a lens. The trade off is, however, that in this case the fiber has to be positioned within 0.5 micron (in the lateral direction) with respect to the optical axis of the cavity in order to avoid exciting undesirable higher order Hermite-Gaussian modes. In order to improve the alignment tolerance of the coupling fiber, a thermally expanded core fiber with mode size of 20–50 microns can be used in conjunction with mirrors with appropriately reduced curvature. The curvature R of the mirror is adjusted based on Equations 1–3 above to match the mode size $W_0$ of the thermally expanded core fiber. Because of the larger size of the Gaussian mode, the lateral positioning of the fiber is relaxed.

This design is distinctly different from the single-crystal, parallel mirror resonator design disclosed in U.S. Pat. No. 4,825,262, issued Apr. 25, 1989 to Stephen R. Mallinson.

The processing steps for the fabrication of a novel MEM tunable filter with a confocal cavity of the present invention are similar to those utilized in the fabrication of a novel planar cavity tunable filter/VCSEL of the present invention. A significant difference is in the deposition of the curved DBR's. Control of the magnitude and type of strain in the deposited multilayer dielectric stack of DBR's, and the supporting thin silicon-nitride membrane, is carefully engineered so as to achieve the desired mirror curvature. The magnitude and the type of strain (tensile or compressive) is introduced in these films by the judicious choice of deposition parameters, such as the ratio of the gas mixtures of silane ($SiH_4$) and ammonia ($NH_3$), the total pressure of the gases used, and the magnitude of RF power used. The resulting stress gradient between the tensile strain silicon-nitride membrane and the compressively strained dielectric mirror stacks results in a concave DBR. Further control of the curvature of the top DBR can be achieved by introducing a stress gradient within the mirror layers by a gradual change of temperature and/or deposition voltage. Alternative methods for introducing the desired stress gradient within the mirror layers include the use of a secondary ion source to selectively modify the stress within each layer of the mirror by varying the current or voltage. In one example, a silicon nitride layer of 0.5 micron thickness, with 100 MPa of tensile stress, was deposited by PECVD, and the top mirror was deposited at 100° C. using ion-beam sputtering at 700 V. The resulting mirror curvature of approximately 1 mm was achieved following removal of the sacrificial layer. Furthermore, varying the temperature of the substrate during the mirror deposition from room temperature to 120° C. resulted in a further stress gradient in the mirror layers, decreasing the mirror curvature to 0.75 mm.

Akin to the confocal-cavity tunable filter (FIG. 1), the innovative micro-cavity design using the confocal resonator scheme also provides a stable fundamental spatial mode in a MEM tunable VCSEL. More particularly, in the case of tunable VCSEL's, the gain medium resides inside the Fabry-Perot cavity defined by a set of planar DBR's and a set of movable curved DBR's, as shown in FIG. 2. Excitation of the gain medium by the fundamental mode leads to laser emission of a single, circular spatial mode. As a result, lateral optical mode confinement arises naturally, without having to form a lateral waveguide. This results in highly efficient VCSEL's.

The confocal cavity scheme is equally applicable to a fixed wavelength VCSEL, as shown in FIG. 5. As explained previously, the fundamental spatial mode in the fixed wavelength VCSEL provides a stable lateral optical confinement, and leads to a single mode laser emission.

Competing Technologies

Currently, there are fixed-wavelength VCSEL's commercially available below 1.0 $\mu$m.

There are no tunable VCSEL's or MEM tunable Fabry-Perot filters commercially available at this time.

The only commercially available tunable filters rely on piezoelectric drivers with a complex feedback system (Queensgate Instruments, England), or on the use of bi-refringent materials sandwiched between cross-polarizers (Cambridge Research Instruments, Massachusetts, using liquid crystals).

Piezoelectric tunable filters have a resolution of about 0.1 nm, with a 50 nm tuning range, but they also require high voltage for operation.

Liquid crystal-based filters can exhibit better resolution, but at the expense of low efficiency, e.g., as low as 99.0%.

The fabrication of the two aforementioned systems is labor-intensive, and thus costly. For example, the top-of-the-line model offered by Queensgate Instruments costs more than $10,000. Such high cost, combined with the bulkiness of these systems, make them unrealistic for most applications. Specifically, in applications such as future communications networks that will deliver voice, video, data and upstream communications to consumers, all through a single optical fiber cable, very low cost, compact filters and laser sources are needed. It is believed that the feasibility of harnessing optical fiber cable bandwidths on a broad scale will hinge upon the availability of compact, low cost devices such as the devices of the present invention.

There has been some past effort towards realizing this goal. This effort has been confined to a small research community, and has resulted in reports of tunable LED's, VCSEL's and MEM tunable Fabry-Perot filters.

For example, Larson et al. have published results on (1) a GaAs-based tunable filter (see, for example, Larson, M. C., Pezeshki, B., and Harris, J. S., "Vertical coupled-cavity microinterferometer on GaAs with deformable-membrane top mirror", IEEE Photonics Technology Letters, Vol. 7, pp. 382–384, 1995); (2) an LED (see, for example, Larson, M. C., and Harris, J. S., "Broadly-tunable resonant-cavity light emission", Applied Physics Letters, Vol. 67, No. 5, pp. 590–592, 1995); and (3) a VCSEL (see, for example, Larson, M. C., Massengale, A. R., and Harris, J. S., "Continuously tunable micromachined vertical-cavity surface emitting laser with 18 nm wavelength range", Electronic Letters, Vol. 32, No. 19, pp. 330–332, 1996).

These results indicate that Larson et al. used GaAs/AlAs for bottom DBR's, and a gold-coated silicon-nitride membrane as the top mirror. In all of the foregoing Larson et al. devices, the top mirror release is accomplished by selectively wet-etching an underlying sacrificial layer of GaAlAs with hydrochloric acid. Since this technique provides no controlled way of undercutting, the length of the support structure for the top mirror is not well defined from device to device. Furthermore, since the top mirror in Larson et al. has lower bandwidth and reflectivity than the dielectric DBR's of the present invention, the tuning range of the devices of Larson et al. is limited, and their spectral linewidth is broader than that provided by the present invention.

Similarly, Tran et al. have shown (1) a tunable Fabry-Perot filter (see, for example, Tran, A. T. T. T., Lo, Y. H., Zhu, Z. H., Haronian, D., and Mozdy, E., "Surface Micromachined Fabry-Perot Tunable Filter", IEEE Photonics Technology Letters, Vol. 8, No. 3, pp. 393–395, 1996); and (2) an LED (see, for example, Christenson, G. L., Tran, A. T. T., Zhu, Z. H., Lo, Y. H., Hong, M., Mannaerts, J. P., and Bhat, R., "Long-Wavelength Resonant Vertical-Cavity LED/Photodetector with a 75-nm Tuning Range", IEEE Photonics Technology Letters, Vol. 9, No. 6, pp. 725–727, 1997); the aforementioned filter and LED using polyimide as the sacrificial layer. This method suffers from the same lack of control over precise length fabrication. In addition, polyimide is not a stable material for making a robust device, because aging tends to degrade the stability of the cavity's length.

A tunable filter (see, for example, Vail, E. C., Wu, M. S., Li G. S., Eng, L. and Chang-Hasnain, C. J., "GaAs micromachined widely tunable Fabry-Perot filters", Electronic Letters, Vol. 31, pp. 228–229, 1995) and a VCSEL (see, for example, Vail, E. C., Li, G. S., Yuen, W. and Chang-Hasnain, C. J., "High performance micromechanical tunable vertical-cavity surface-emitting lasers", Electronic Letters, Vol. 32, No. 20, pp. 1888–1889, 1996) also have been reported by Vail et al. The Vail et al. devices use GaAs/AlAs for the top and bottom DBR's, with a GaAs sacrificial layer for top DBR release. Although Vail et al. use a dry-etching technique to selectively remove the sacrificial GaAs layer, precise control of the top mirror length is still not feasible.

The present invention is distinct from the aforementioned devices in the following aspects, among others:

1. the present invention provides a precise method for defining the lateral dimensions of the top mirror support and the cavity length by deposited supporting posts;
2. the present invention provides an optimized control of the VCSEL gain properties by control of the strain in the deposited DBR; and
3. the confocal design of the VCSEL structure allows single spatial modes, lower threshold and efficient coupling into a single mode fiber.

BRIEF DESCRIPTION OF THE DRAWINGS

The description of the present invention is intended to be considered in conjunction with the drawings, wherein like elements are referred to by like reference numerals throughout, and further wherein.

FURTHER ASPECTS OF THE INVENTION

A MEM tunable filter 2, and a MEM tunable VCSEL 4, are shown in FIGS. 3 and 4, respectively.

More particularly, and looking now at FIG. 4, tunable VCSEL 4 includes a gain medium 6, usually comprising multiple quantum wells, located in a mechanically tunable high-Q Fabry-Perot cavity 8 formed by a pair of spaced-apart DBR's 10 and 12, respectively. In the present invention, one of the DBR's 12 can be translated towards the other of the DBR's 10 by an applied electrostatic field. This changes the Fabry-Perot cavity length, and provides tuning in the emission wavelength. The VCSEL can be photo-pumped, or charge-injection may be accomplished by intra-cavity electrical interconnections.

Further, the same basic structure, without the gain medium, functions as a tunable filter (see FIG. 3).

Figure 1:
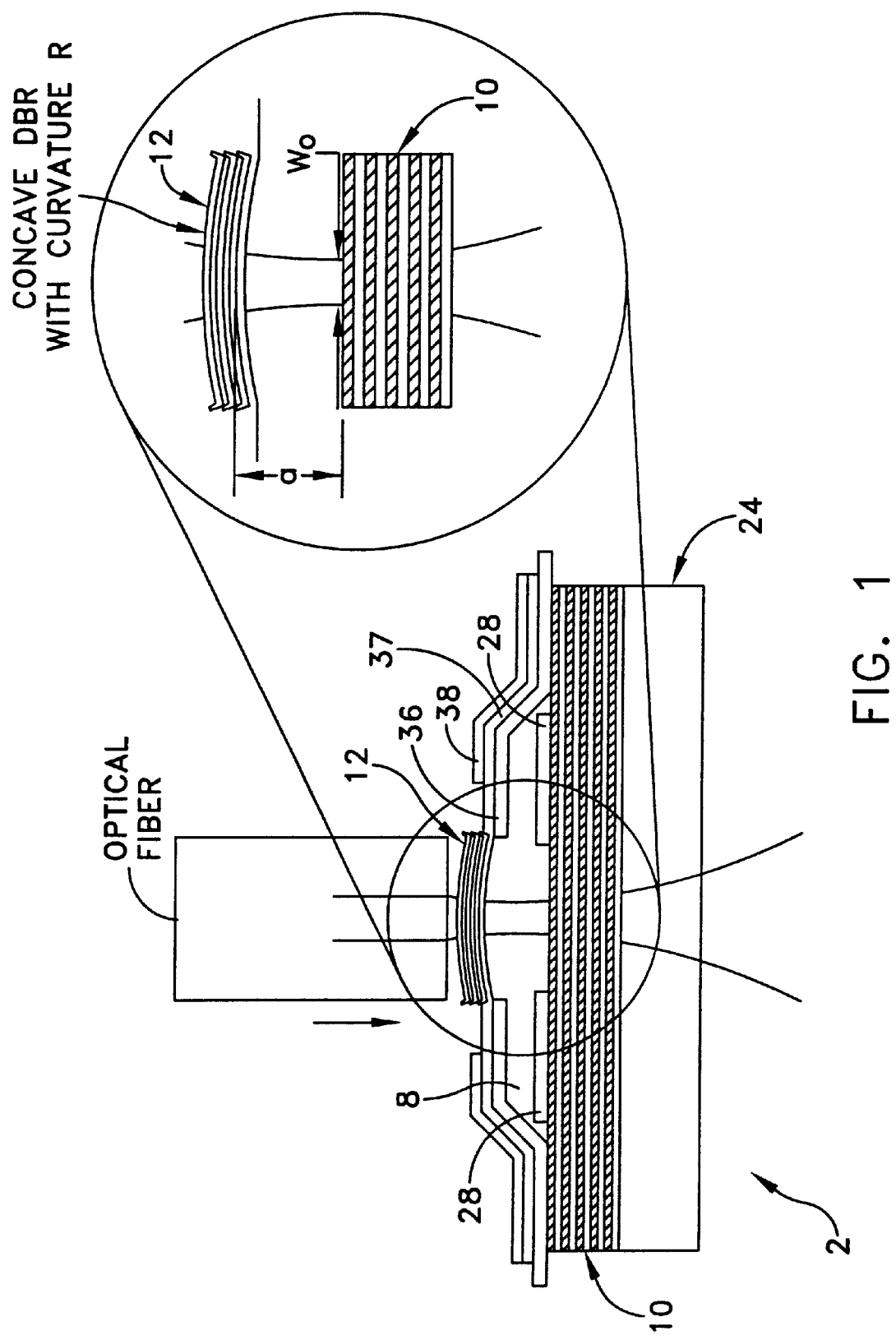
FIG. 1 is a side elevational view, in cross-section, schematically and diagrammatically illustrating a microelectromechanical tunable filter having a confocal cavity.
Figure 2:
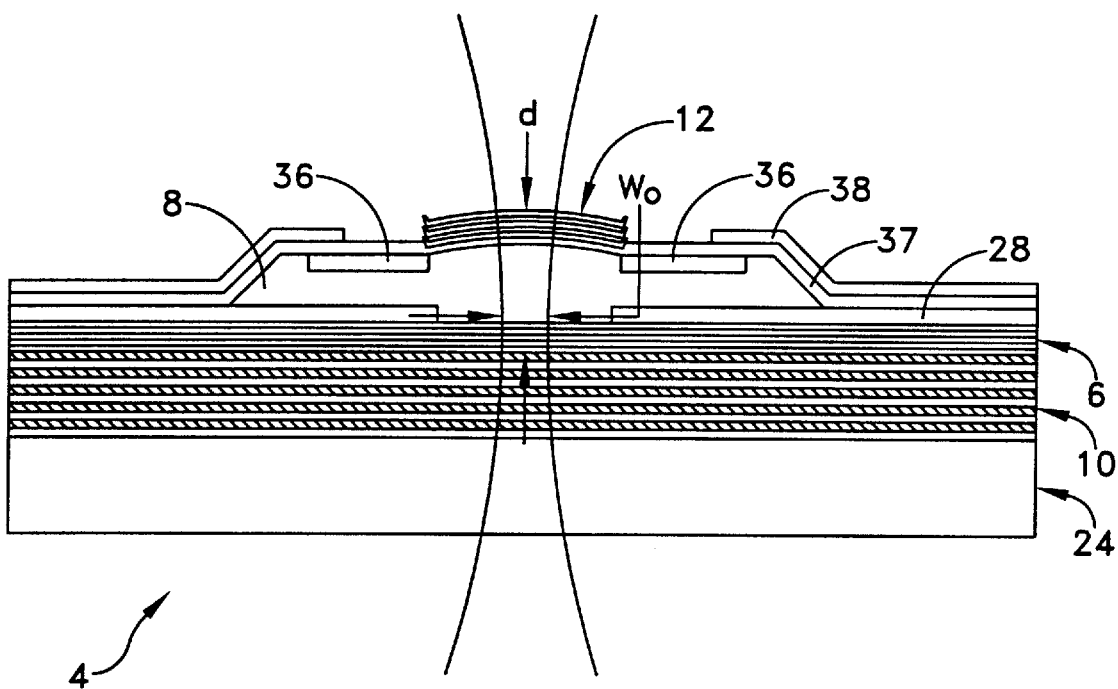
FIG. 2 is a side elevational view, in cross-section, schematically and diagrammatically illustrating a tunable vertical cavity surface emitting laser having a confocal cavity.
Figure 5:
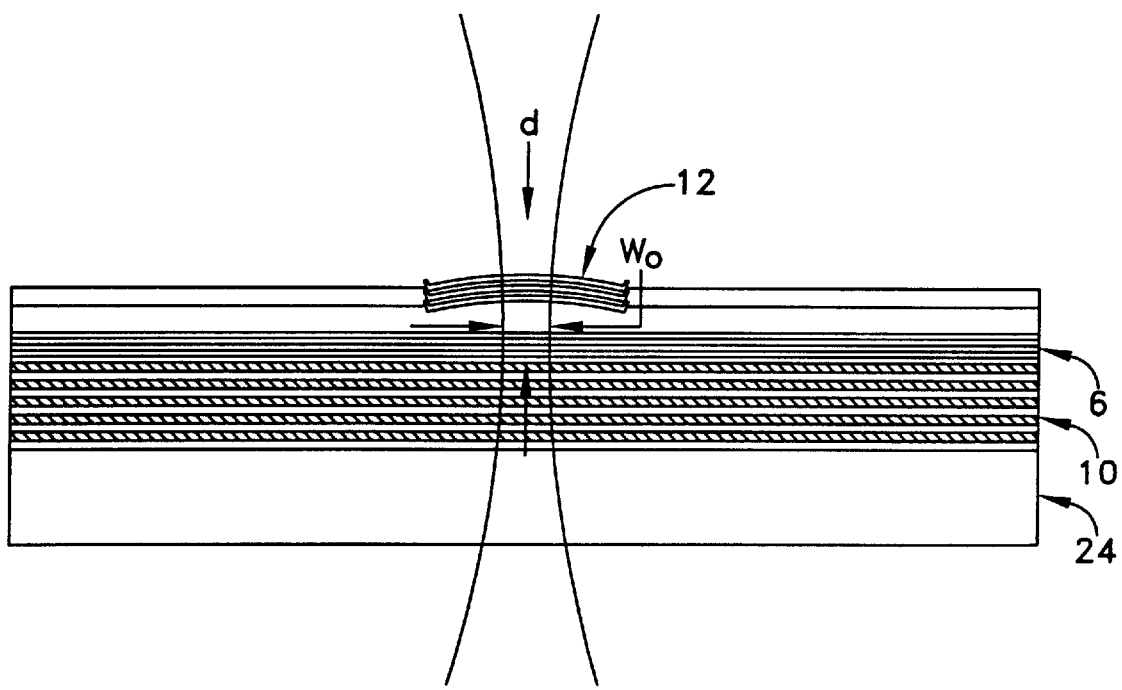
FIG. 5 is a side elevational view, in cross-section, schematically and diagrammatically illustrating a fixed-wavelength vertical cavity surface emitting laser having a confocal cavity.

If desired, the top DBR 12 can be formed with a curved configuration, so as to form a confocal filter (FIG. 1) or confocal VCSEL (see FIG. 2).

Quantum wells provide the necessary gain during stimulated emission in semiconductor lasers. In the case of a VCSEL, the resonant optical mode inside the micro-cavity interacts with an extremely small volume of this gain medium. As a result, it is important to provide maximum gain per quantum well over the interaction volume. The best method for accomplishing this is to grow the quantum wells under compressive strain. Compressive strain in the quantum wells leads to anisotropy in the band structure, and to splitting of the degeneracy of the in-plane heavy-hole and light-hole bands, resulting in heavy-hole band shifting of several tens of meV (for 1% compressive strain) above the light-hole band. While the anisotropy leads to a reduction in the in-plane heavy-hole effective mass, which reduces the density of states available for transition near the zone center, the splitting of the degeneracy leads to a preferential population inversion between the conduction band and the desired heavy-hole band. Due to these two effects, the threshold current density decreases, temperature sensitivity is improved, and differential efficiency increases. Compressively strained multiple quantum wells are especially desirable at about 1300 nm and about 1500 nm, since Auger recombination and inter-valence band absorption contribute to intrinsic loss at these long wavelengths. Therefore, the importance of maximizing gain in VCSEL's cannot be over-emphasized.

Strained multiple quantum wells are difficult to grow, and are expensive compared to unstrained quantum wells.

In the present invention, a method is provided for introducing a desired strain in the unstrained quantum wells of any semiconductor material after the crystal has been grown. The process requires depositing dielectric films with a controlled amount of strain. In the case of VCSEL's, it has been found preferable to deposit one of the DBR stacks with a judiciously chosen strain.

Figure 7:
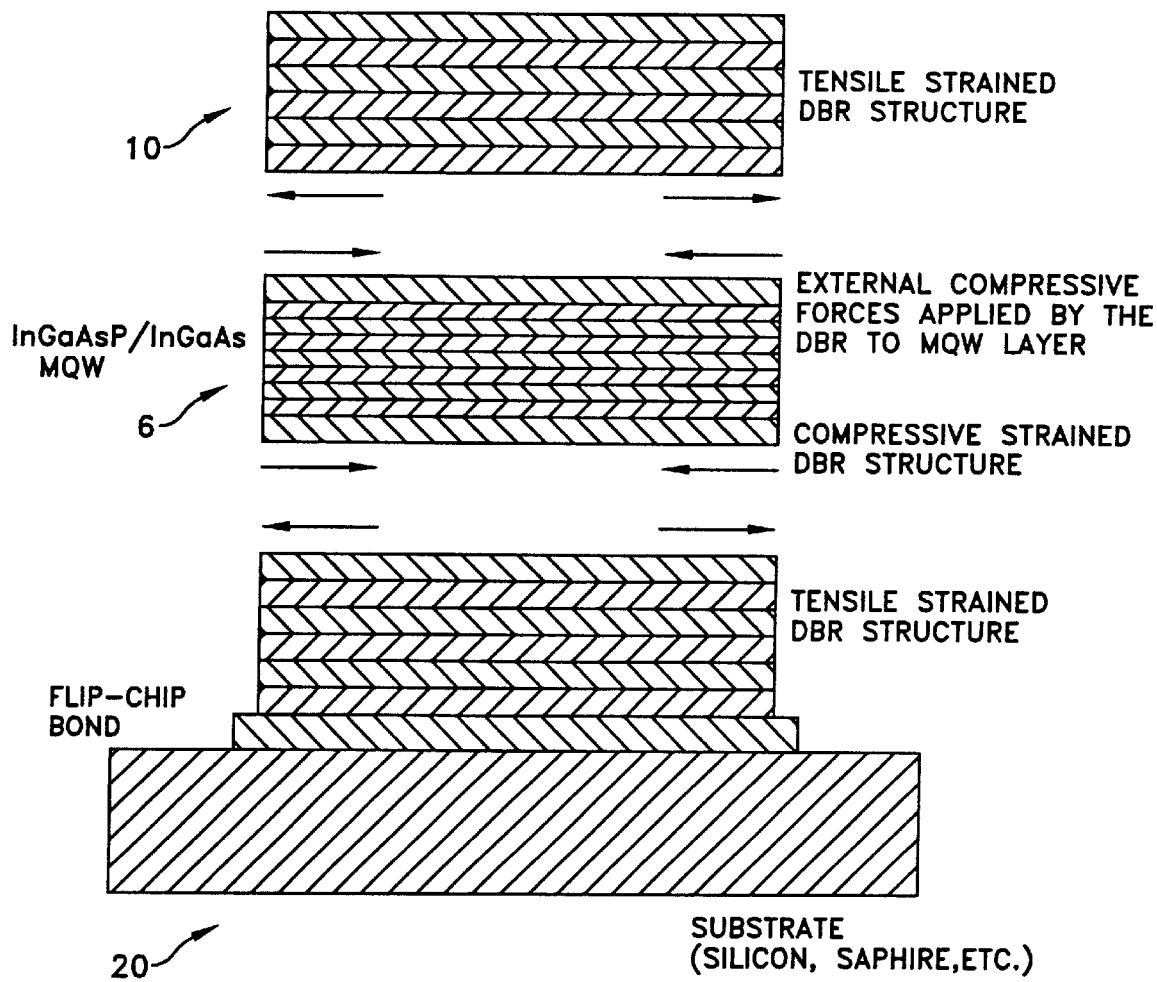
FIG. 7 is a schematic diagram illustrating compressive strain induced in a multiple quantum well structure by strained dielectric distributed Bragg reflectors.

For example, and looking now at FIG. 7, in order to induce compressive strain in the quantum wells, DBR stacks 10, with tensile strain, will be deposited on top of a MQW structure 6 (for example, a InGaAsP/InGaAs MQW), and subsequently flip-chip bonded to a temporary host substrate 20 such as silicon. Thereafter, the temporary host substrate 20 will be selectively removed using an epitaxial lift-off process, and the second set of DBR's will be deposited.

The amount of strain introduced into the MQW by the foregoing process may be approximated by the following equation:

$$\frac{\Delta a}{a} = -\frac{2Pl_2}{c_{11}l_1}$$

where P is the compressive stress in one of the DBR layers; $c_{11}$ is the average coefficient of stiffness (Young's modulus) of the MQW layers; $l_2$ is the thickness of the MQW layers; and $l_1$ is the thickness of the dielectric DBR's. From this equation, it is evident that several Mega Pascals of tensile strain in the DBR's will induce roughly 1% compressive strain in the MQW that are initially lattice-matched. Controlled strain in the DBR's can be introduced by controlling the energy of the ion-beam during deposition of the DBR's, as discussed above. Typically, a few Kilo Pascal to a few Giga Pascal of stress (tensile or compressive) can be introduced in DBR pairs of $Si/Al_2O_3$, $Si/SiO_2$, $Si/MgO$ or $TiO_2/SiO_2$ in this manner.

Device Fabrication

Figure 6A:
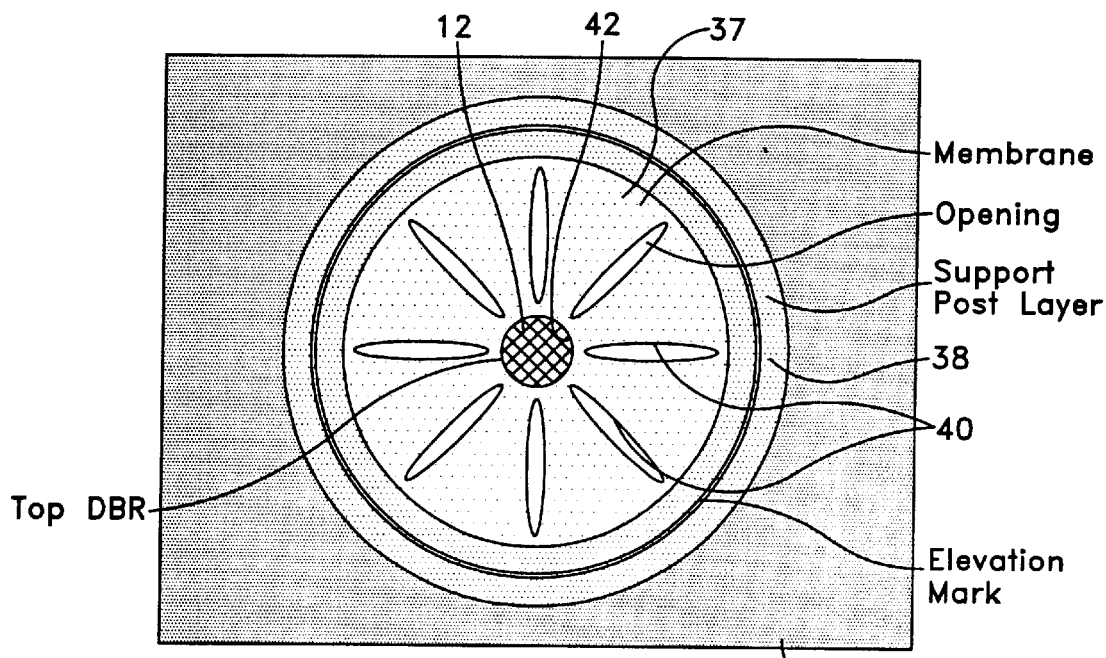
FIGS. 6A–6E show top elevational diagrammatic views of five different forms of the tunable filter/VCSEL device, with FIG. 6A showing a membrane type structure with radial slits, FIG. 6B showing a four tether device structure, FIG. 6C showing a three tether device structure FIG. 6D showing a membrane type structure with holes, and FIG. 6E showing a membrane type structure with a spiral slit.
Figure 6B:
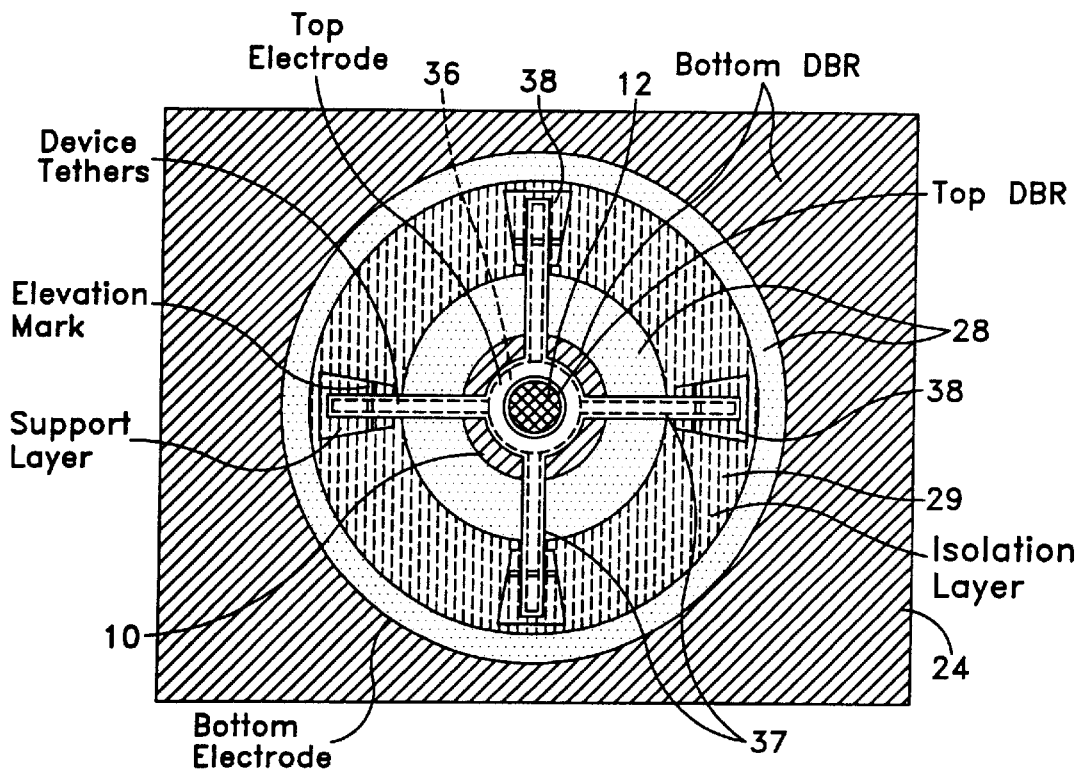
Figure 6C:
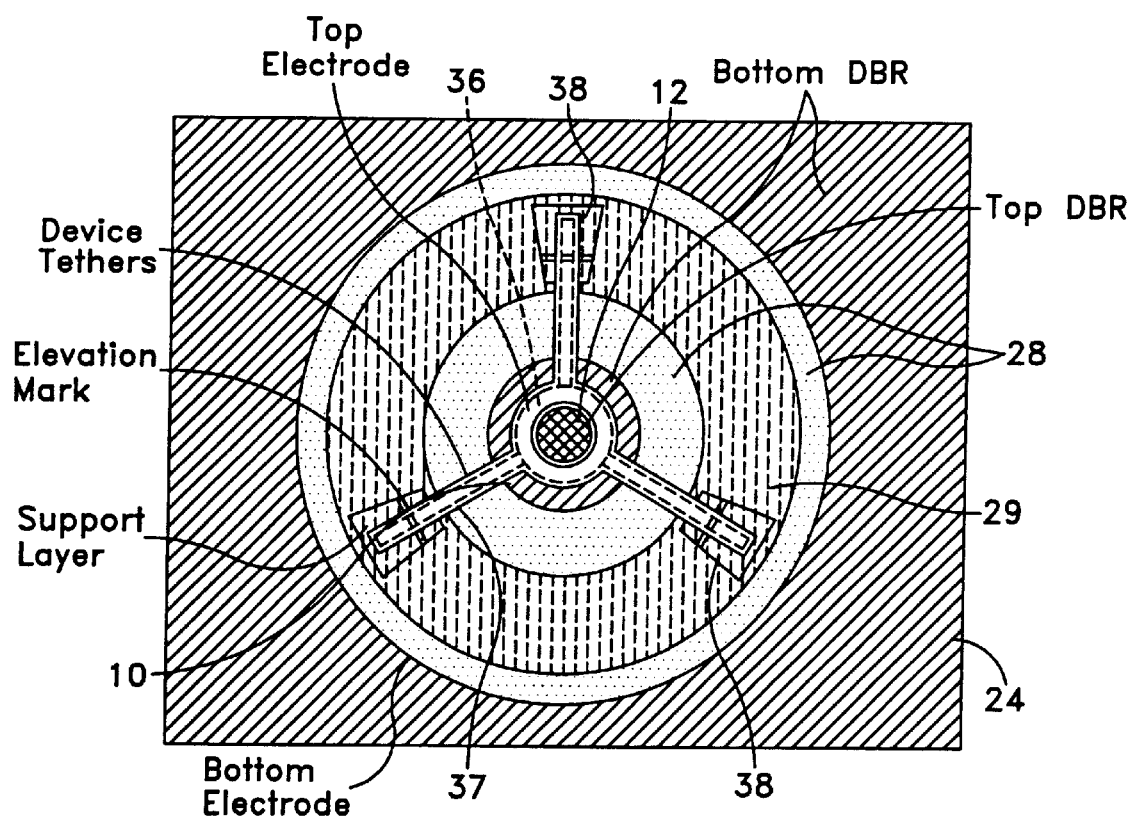

A schematic top view of three embodiments of the tunable VCSEL or filter structure is depicted in FIGS. 6A–6C.

In FIGS. 3 and 4, schematic cross-sectional views of the fabrication steps used in making microelectromechanical, tunable filters and VCSEL's are shown, respectively. Although the two structures (i.e., the tunable filters and VSCEL's) resemble each other in form, there are subtle differences in the fabrication steps utilized in making the two different devices. The fabrication steps for each of these devices are discussed in detail below.

MEM Tunable VCSEL/Filter Fabrication Procedure

Figure 3A:
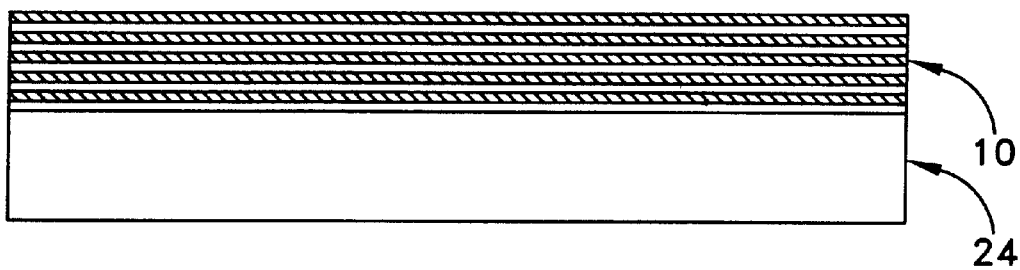
FIG. 3 (i.e., FIGS. 3A–3F) comprises a series of side elevational, diagrammatic, cross-sectional views schematically illustrating the fabrication procedure for making a microelectromechanical tunable filter.
Figure 3B:
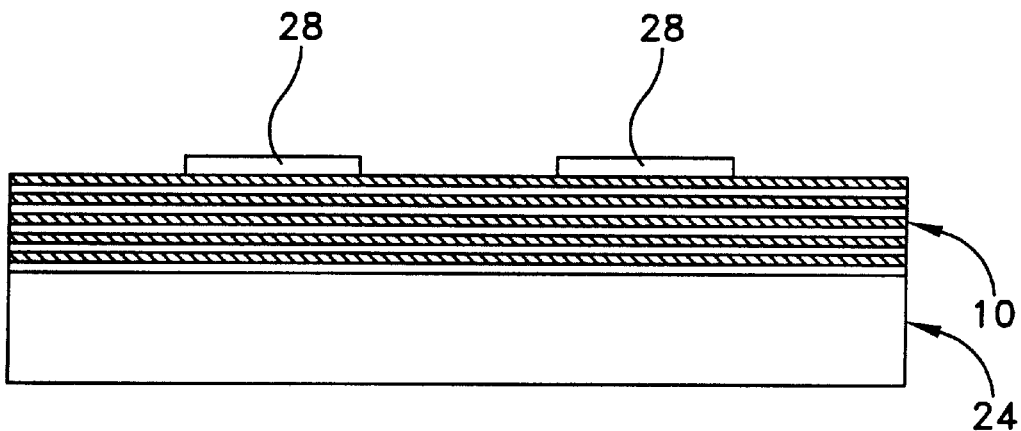

1. When fabricating a tunable VCSEL, DBR's 10 are deposited on top of the MQW structure 6. DBR's 10 preferably comprise alternating layers of quarter-wavelength thick deposited dielectric films. In one preferred form of the invention, these dielectric films may be fabricated from the group consisting of Si; $Al_2O_3$; $SiO_2$; $TiO_2$; MgO; $Ta_2O_5$; zirconium oxide; or any combination thereof. The MQW structure 6, with the DBR's 10 deposited thereon, is applied to a suitable temporary substrate 20, such as silicon, GaAs or sapphire. This is accomplished by a method such as flip-chip bonding, fusion bonding or Van der Waals bonding (see FIG. 4A). On the other hand, when fabricating a tunable filter, the DBR's 10 are deposited directly onto a host substrate of choice 24 (FIG. 3A).

Figure 4A:
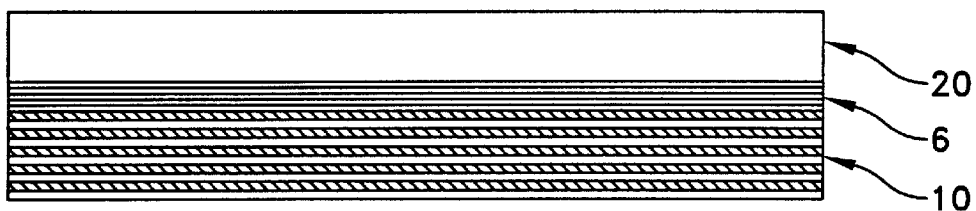
FIG. 4 (i.e., FIGS. 4A–4G) comprises a series of side elevational, diagrammatic, cross-sectional views schematically illustrating the fabrication procedure for making a microelectromechanical, tunable, vertical cavity surface emitting laser.
Figure 4B:
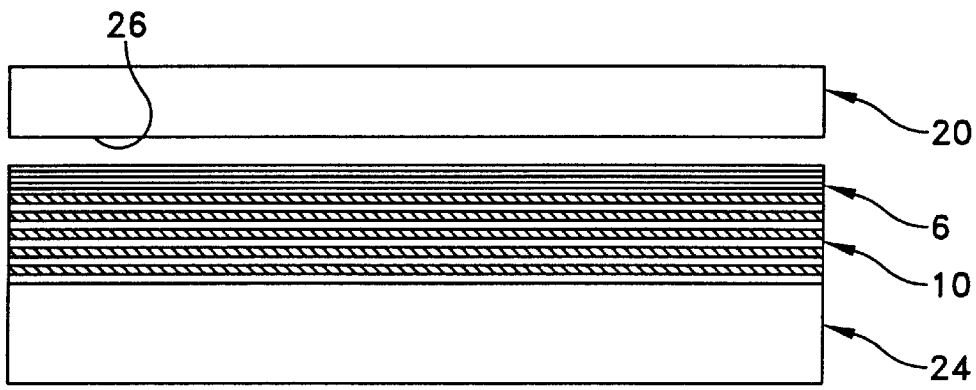

2. When fabricating a tunable VCSEL, the structure of FIG. 4A is mounted to a host substrate of choice 24 (FIG. 4B). Next, the temporary substrate 20, upon which the MQW structure 6 resides, is selectively removed by an etch-back technique (FIG. 4B). In this method, a highly selective etchant is used to etch the temporary substrate 20, and etching is terminated at a strategically located etch-stop layer 26. It has been found that a one-to-one mixture of concentrated hydrochloric acid and hypochloric acid removes InP preferentially over InGaAs. In the case of a GaAs substrate, a citric acid and hydrogen peroxide mixture can be used for selective removal of the temporary substrate 20 over AlAs. Another approach, which has been found to be useful with GaAs substrates, is to grow a thin layer of AlAs between the temporary substrate 20 and the MQW structure 6 deposited thereon. The AlAs may then be selectively etched. This allows the MQW structure 6 to be lifted away from the GaAs substrate.

Figure 4C:
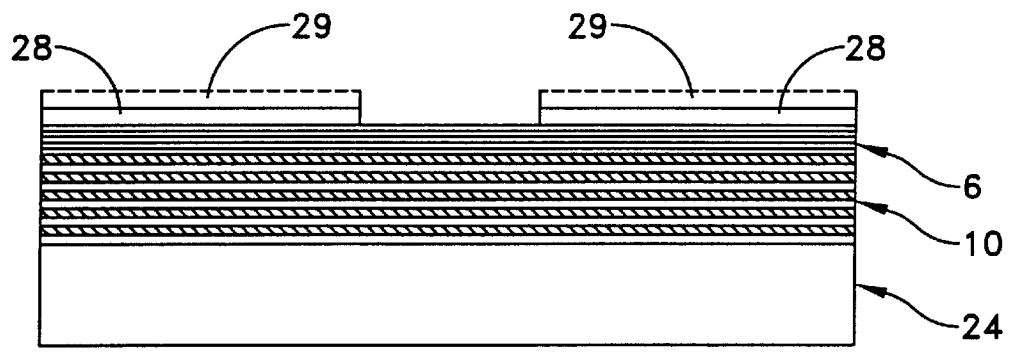

3. At this stage, one of the tuning electrodes, 28, is deposited on top of the DBR layer 10 in the case of a tunable filter 2 (FIG. 3B), and on top of the MQW structure 6 in the case of tunable VCSEL 4 (FIG. 4C). If appropriate, an isolation layer 29 (i.e., an electrically insulating layer) may then be deposited atop some or all of the electrodes 28. See, for example, FIG. 4C, where an isolation layer 29 is shown (in phantom) atop electrodes 28.

Figure 3C:
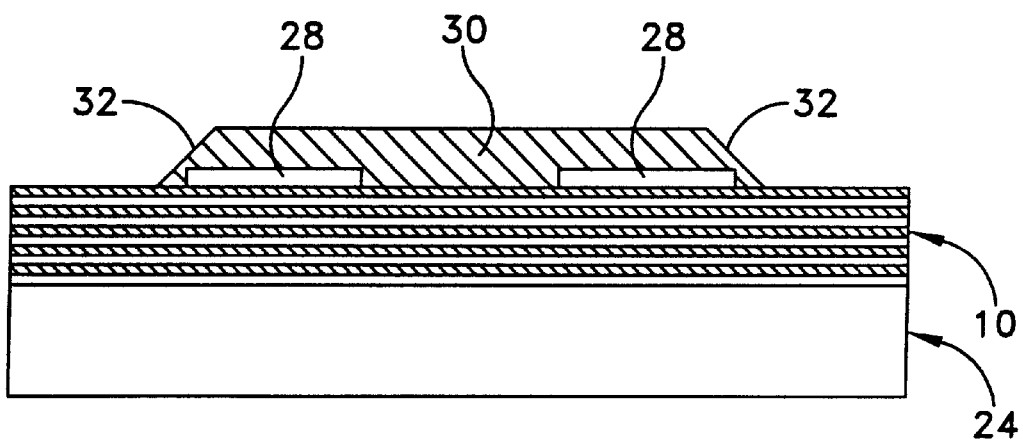

4. After the DBR layer 10 (in the case of a filter), or the MQW structure 6 and DBR layer 10 (in the case of a VCSEL), has been deposited on the substrate 24, a calibrated thickness 30 of polyimide, or aluminum, or some other sacrificial material, is deposited on top of the MQW structure 6 in the case of tunable VCSEL (FIG. 4D), and on top of the DBR layer 10 in the case of a tunable filter (FIG. 3C). The polyimide or aluminum structure 30 will act as a sacrificial layer later in the method as described in detail below. It should be appreciated that it is very important to accurately control the thickness and lateral dimensions of the polyimide or aluminum structure 30. This is because the thickness of this deposit will determine the ultimate length of the air cavity 8 in the tunable Fabry-Perot device and, hence, the unbiased resonant wavelength of the device. The lateral dimension of the polyimide or aluminum deposit 30, on the other hand, determines the voltage response of the device and the resonance frequency.

Figure 4D:
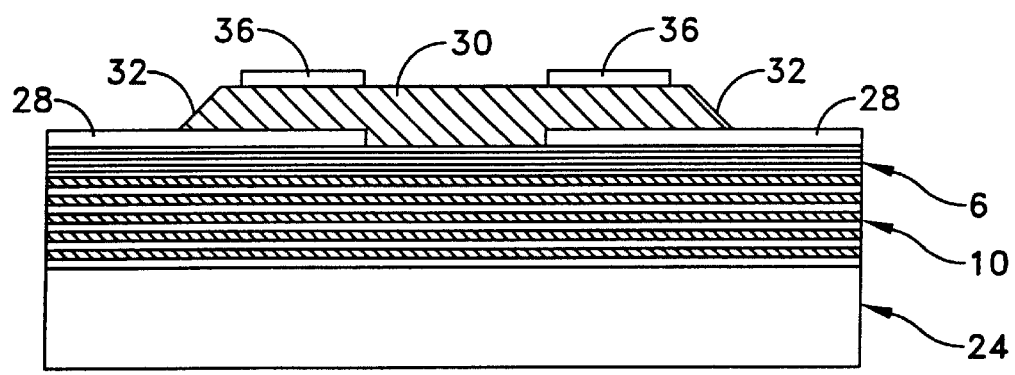

5. Thereafter, an etch-mask is used to pattern the polyimide or aluminum deposit 30 so as to leave a circular disk-shaped deposit defining an outwardly slanted edge 32 on its etched perimeter (FIGS. 3C and 4D). The size and shape of the etched deposit 30 is carefully designed and controlled because its outer surface will determine the length of the top mirror support. Specifically, the disk of polyimide or aluminum acts like a "micro-die" which precisely controls the lateral dimensions and shape of the tunable VCSEL or filter. This precise control of the lateral dimensions of the tunable VCSEL or filter is unparalleled by any existing techniques employed in existing MEM tunable VCSEL or filter fabrication. As alluded to above, later in the process, the polyimide or aluminum layer 30 will be selectively removed using a suitable dry-etching technique.

6. In the case wherein a $Si_3N_4$ membrane is used for top mirror support, a thin layer 36 (FIGS. 3D and 4E) of metal is first deposited on the exposed top surface of the polyimide or aluminum deposit to form the top tuning electrode.

Figure 3D:
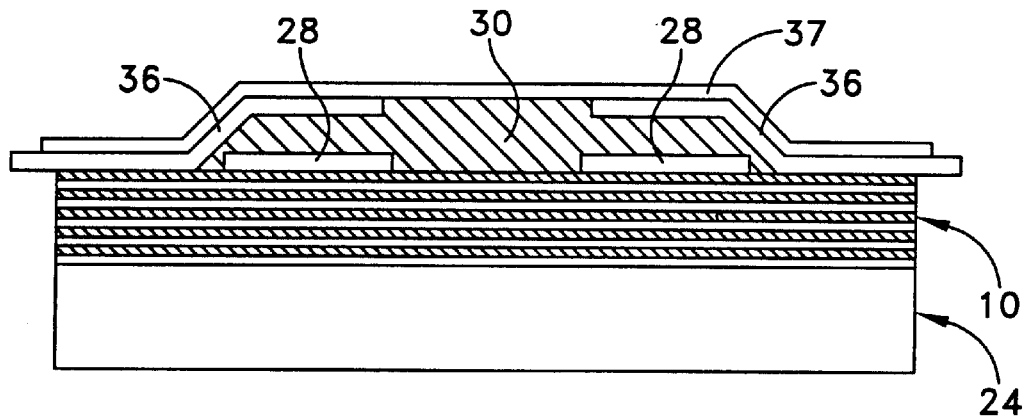
Figure 3E:
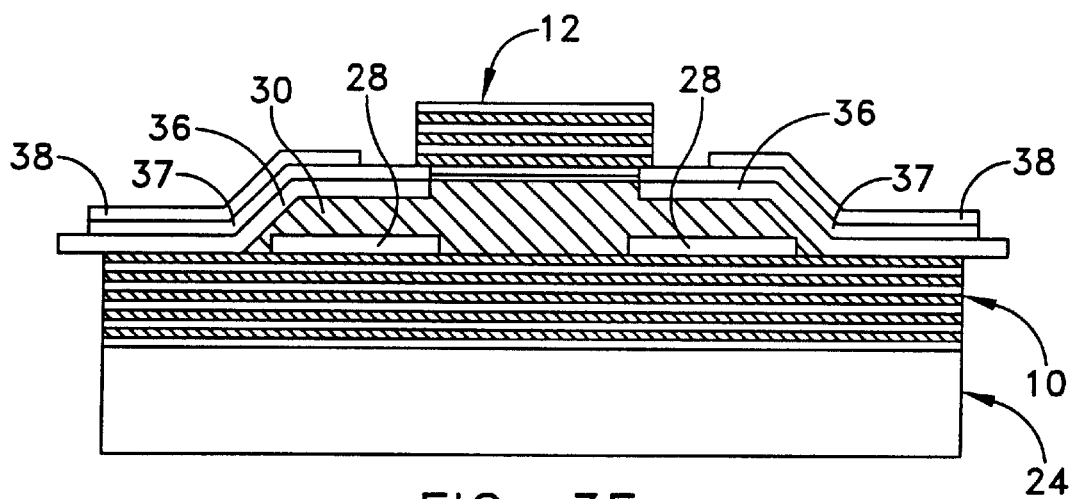
Figure 4E:
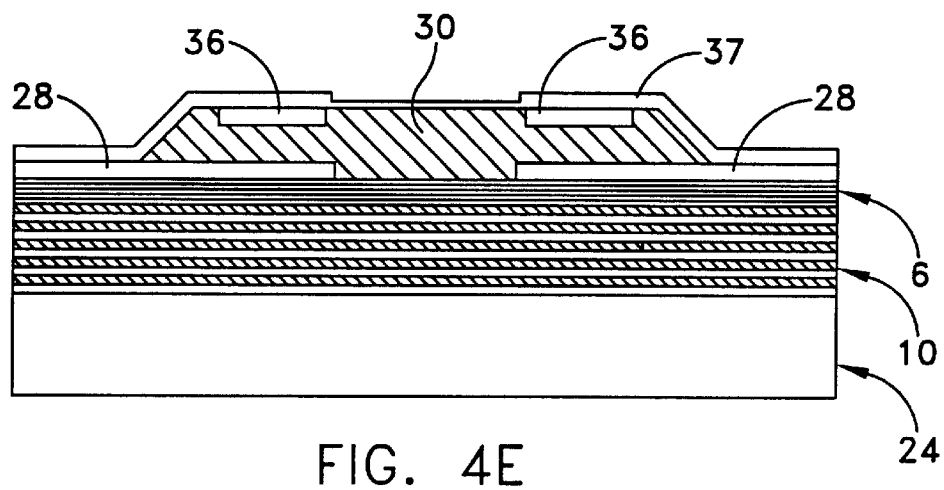

7. Thereafter, either a thin layer of silicon nitride or a thin layer of another metal other than aluminum, e.g., titanium-tungsten (TiW), generally shown at 37, is deposited over the entire structure, i.e., over the polyimide or aluminum sacrificial layer 30 and the remaining structure (FIGS. 3D and 4E). In the case where layer 37 is not transparent, the center portion is removed (see FIGS. 3D and 3E, and FIG. 4E).

Figure 4F:
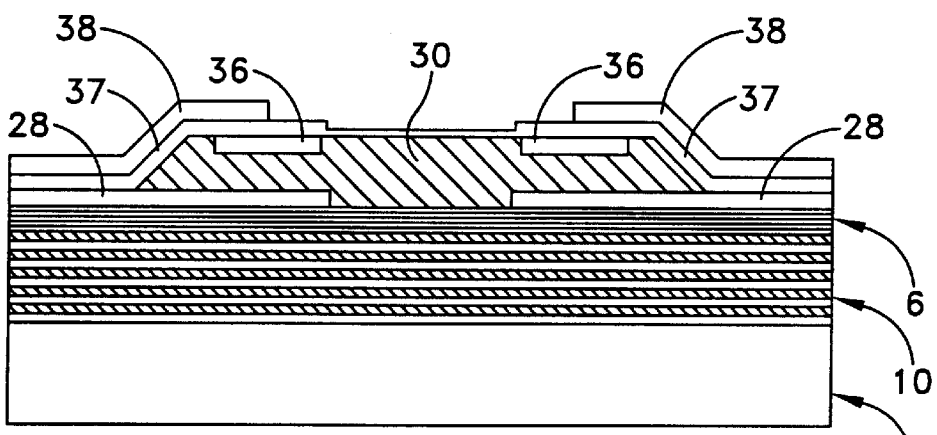
Figure 6D:
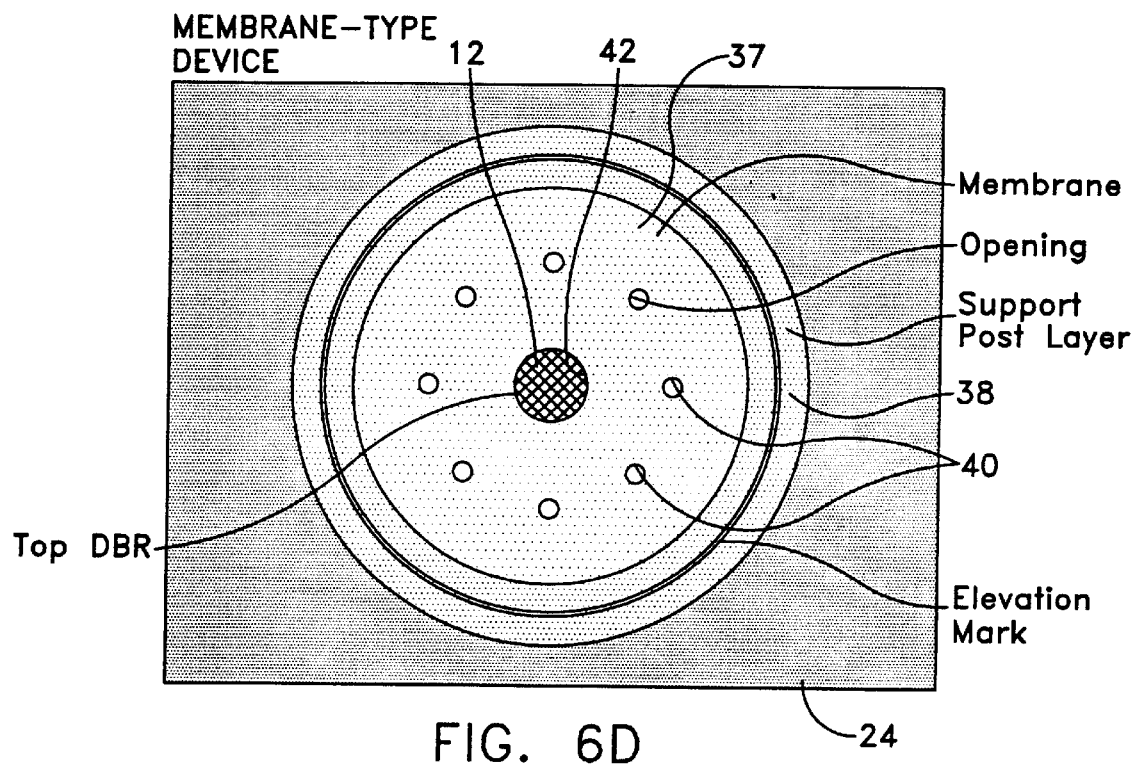
Figure 6E:
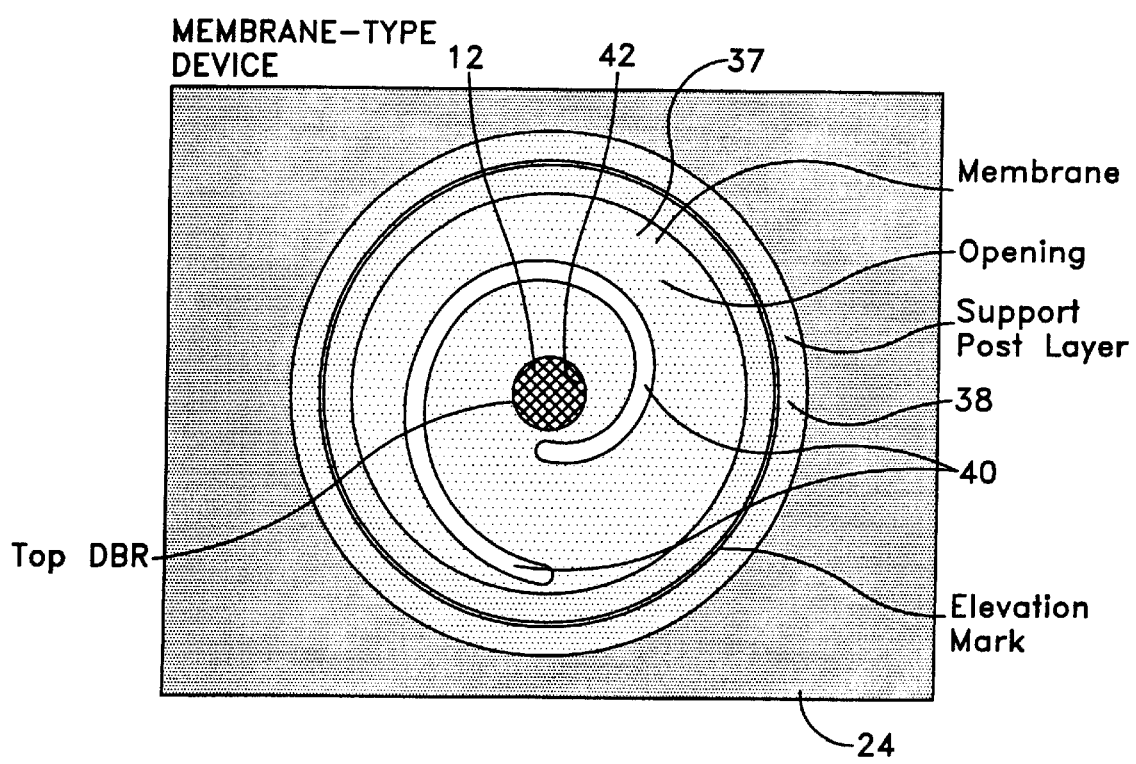

8. A thick layer 38 of metal (such as Al or TiW) or hard dielectrics (such as silicon nitride) forming a rim (in case of a membrane type device such as is shown in FIGS. 6A, 6D or 6E) or patches of support forming arms (in the case of a tether device such as is shown in FIGS. 6B or 6C) is then selectively deposited on the periphery of the device membrane where the device membrane or tethers meet the underlying support structure, e.g., electrode 28 and/or isolation layer 29 and/or; the bottom DBR. The radial dimension of annulus or support patches 38 is selected such that a thick metal rim extends from above the top of the bottom DBR 10, over the sloped edge 32 of the sacrificial layer 30 of polyimide or aluminum, and over part of the top of the sacrificial disk 30, as indicated in FIGS. 3E and 4F. This is an important innovation because the thick metal structure 38 provides robust support to the thin membrane 37 of silicon nitride or TiW after the underlying sacrificial layer 30 of polyimide or aluminum has been removed.

9. Using an etch-mask, radially emanating openings 40 (FIG. 6A) then are formed by etching through the transparent metal and silicon nitride or the thin (TiW) film, 37, down to the underlying sacrificial disk 30. These openings provide gateways for the etchants to selectively remove the underlying sacrificial disk 30.

10. A circular top DBR stack 12 (preferably comprising alternating layers of quarte-wavelength thick deposited dielectric films), extending tens of micrometer in diameter, is then selectively deposited only at the center 42 (FIGS. 6A–6E) of the silicon nitride/metal membrane or TiW film 37. DBR stack 12 preferably comprises alternating layers of quarter-wavelength thick deposited dielectric film. In one preferred form of the invention, these dielectric films may be fabricated from the group consisting of Si; $Al_2O_3$; $SiO_2$; $TiO_2$; MgO; $Ta_2O_5$; zirconium oxide; or any combination thereof. This selective deposition provides an extremely good quality DBR, and avoids having to etch the top DBR, which can be a difficult and costly effort. To the extent that top DBR stack 12 is to assume a curved configuration in the completed device (e.g., as shown in FIGS. 1 and 2), an appropriate magnitude and type of strain is introduced into top DBR stack 12 during deposition of the top DBR stack, in the manner discussed above.

Figure 3F:
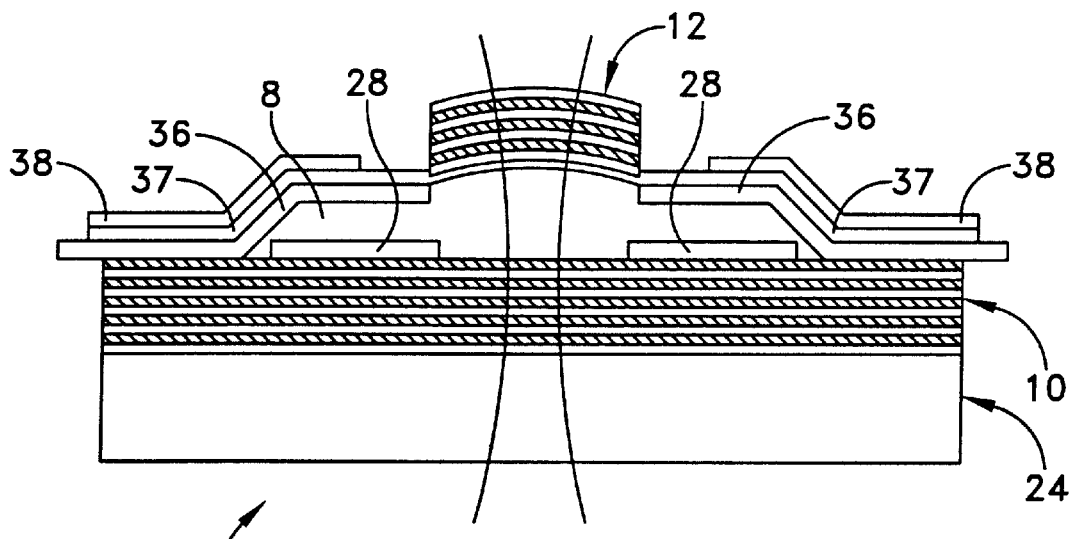
Figure 4G:
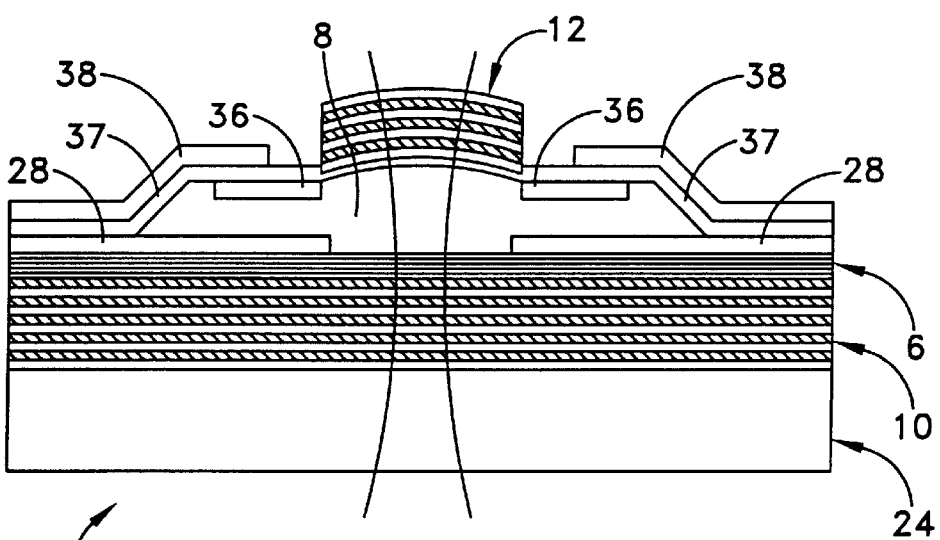

11. Finally, an oxygen plasma is used to selectively remove the polyimide layer 30 (FIGS. 3F and 4G). This releases the silicon nitride/metal membrane 37 along with the top DBR 12. To the extent that top DBR stack 12 is formed with an appropriate magnitude and type of strain to result in the formation of a curved DBR stack, the release of silicon nitride/metal membrane 37 permits the top DBR stack 12 to assume its desired curved configuration. $CF_4$ plasma is used in the case of selective removal of an aluminum sacrificial layer 30. Since wet chemistry is not involved, there is no risk of the released silicon nitride/metal membrane or TiW film, 37, collapsing due to surface tension.

This completes the fabrication of a MEM tunable filter/VCSEL in which lasing can be accomplished by photo-pumping with a separate pump laser having a wavelength that is highly absorptive within the gain spectrum of the MQWs being used. The techniques discussed in the present invention to achieve wavelength tuning can be easily adapted to a current-injected MEM tunable VCSEL as well. In this situation, intra-cavity electrical interconnections have to be made to the p-i-n junction in the MQW structure after the first mirror deposition step, which was explained in step 1 of the tunable VCSEL fabrication procedure.

It will be understood that the foregoing detailed description of preferred embodiments of the invention has been presented by way of illustration, and not limitation. Various modifications, variations, changes, adaptations and the like will occur to those skilled in the art in view of the foregoing specification. Accordingly, the present invention should be understood as being limited only by the terms of the claims.

What is claimed is:

1. A microelectromechanically tunable vertical cavity surface emitting laser, said laser comprising:

(a) a substrate having an upper surface;

(b) a first mirror having a first upper surface located on the upper surface of said substrate;

(c) a layer of gain material having a second upper surface and defining multiple quantum wells, said layer of gain material being located on said first upper surface;

(d) a first electrode deposited on said second upper surface;

(e) a membrane having an upper surface and a lower surface and a periphery, at least part of said membrane carrying a second electrode on its lower surface in spaced relation to said first electrode, said membrane defining the length and lateral dimensions of an air cavity located between said first and second electrodes;

(f) a thick support structure attached to at least a portion of said periphery of said at least a part of said membrane carrying said second electrode, said support structure being adapted to stabilize said membrane; and (g) a second mirror located centrally of said at least a part of said membrane carrying said second electrode, said second mirror being disposed on said upper surface of said membrane, wherein said second mirror is translatable relative to said first mirror in response to an electric field applied between said electrodes.

2. A laser according to claim 1 wherein said substrate comprises a semiconductor material.

3. A laser according to claim 1 wherein said multiple quantum wells are compressively stressed.

4. A laser according to claim 1 wherein said mirrors comprise distributed Bragg reflectors.

5. A laser according to claim 1 wherein said membrane comprises a plurality of openings therethrough, between said second mirror and said support structure.

6. A laser according to claim 1 wherein said support structure comprises an annulus formed from a material selected from the group consisting of silicon nitride and titanium tungsten.

7. A laser according to claim 1 wherein said membrane is fabricated from the group consisting of $Si_3N_4$ and TiW.

8. A laser according to claim 1 wherein said first mirror is planar and said second mirror is curved, so as to form, between said mirrors, a confocal stable resonator.

9. A laser according to claim 4 wherein said distributed Bragg reflectors comprise alternating layers of quarter-wavelength thick deposited dielectric films.

10. A laser according to claim 5 wherein said openings comprise radial slits.

11. A laser according to claim 5 wherein said openings comprise holes.

12. A laser according to claim 5 wherein said openings comprise a spiral slit.

13. A laser according to claim 8 wherein said confocal stable resonator has a well-defined near-Gaussian mode structure.

14. A laser according to claim 8 wherein said second mirror has a radius of curvature, said radius of curvature being optimized such that said mode size of said cavity matches the size of the core of an optical fiber.

15. A laser according to claim 9 wherein said dielectric films are fabricated from the group consisting of Si; $Al_2O_3$; $SiO_2$; $TiO_2$; MgO; $Ta_2O_5$; zirconium oxide; or any combination thereof.

* * * * *